(12) United States Patent
Iwanaga

(10) Patent No.: US 6,396,562 B1
(45) Date of Patent: May 28, 2002

(54) MICRODEVICE MANUFACTURING APPARATUS

(75) Inventor: Takehiko Iwanaga, Kituregawamachi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/451,872

(22) Filed: Dec. 1, 1999

(30) Foreign Application Priority Data

Dec. 2, 1998 (JP) .......................................... 10-357006

(51) Int. Cl.[7] .......................... G03B 27/52; G03B 27/42
(52) U.S. Cl. ............................................ 355/30; 355/53
(58) Field of Search ................................ 355/30, 53, 72, 355/73, 76

(56) References Cited

U.S. PATENT DOCUMENTS

| | | | | |
|---|---|---|---|---|
| 4,786,947 A | * | 11/1988 | Kosugi et al. ................. 355/30 |
| 4,989,031 A | * | 1/1991 | Kamiya ......................... 355/30 |
| 5,187,519 A | * | 2/1993 | Takabayashi et al. ......... 355/53 |
| 5,610,686 A | * | 3/1997 | Osanai .......................... 355/72 |
| 5,623,853 A | | 4/1997 | Novak et al. ............. 74/490.09 |
| 5,691,806 A | * | 11/1997 | Tokuda et al. ................. 355/72 |
| 6,002,987 A | * | 12/1999 | Kamiya et al. ............... 702/56 |
| 6,131,873 A | * | 10/2000 | Blazon et al. .............. 248/548 |
| 6,173,104 B1 | * | 1/2001 | Polidori ...................... 385/136 |
| 6,222,614 B1 | * | 4/2001 | Ohtomo ....................... 355/53 |

FOREIGN PATENT DOCUMENTS

JP 11-82609 3/1999

* cited by examiner

Primary Examiner—Russell Adams
Assistant Examiner—Roy Fuller
(74) Attorney, Agent, or Firm—Fitzpatrick, Cella, Harper & Scinto

(57) ABSTRACT

A device manufacturing apparatus includes a plurality of component units, and a cable element and/or a pipe element, for connecting one of the units with another, wherein the cable element or the pipe element connects the units through a member which is isolated from the units with respect to vibration, such that transmission of vibration between the units can be prevented.

11 Claims, 7 Drawing Sheets

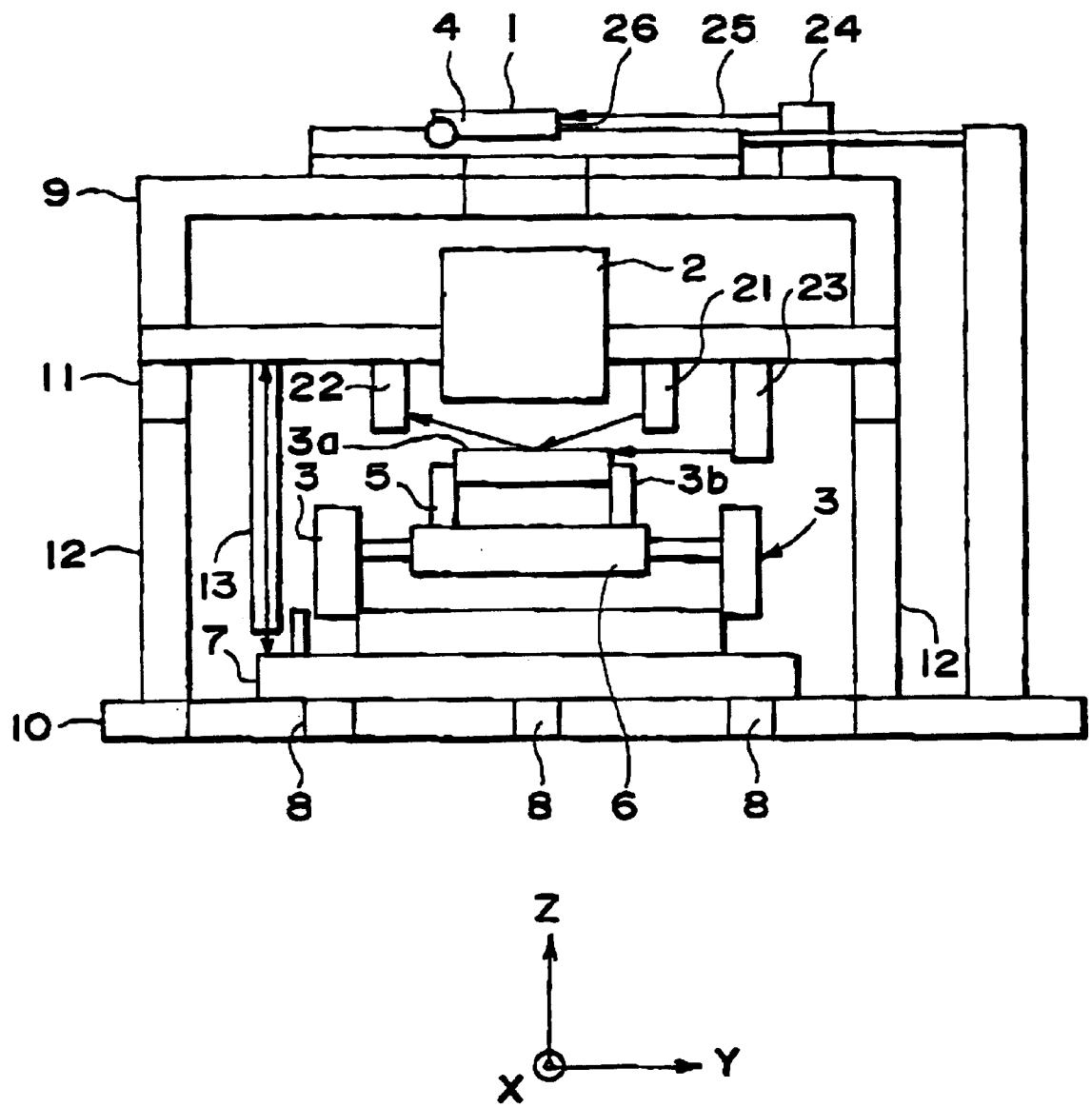
F I G. 1

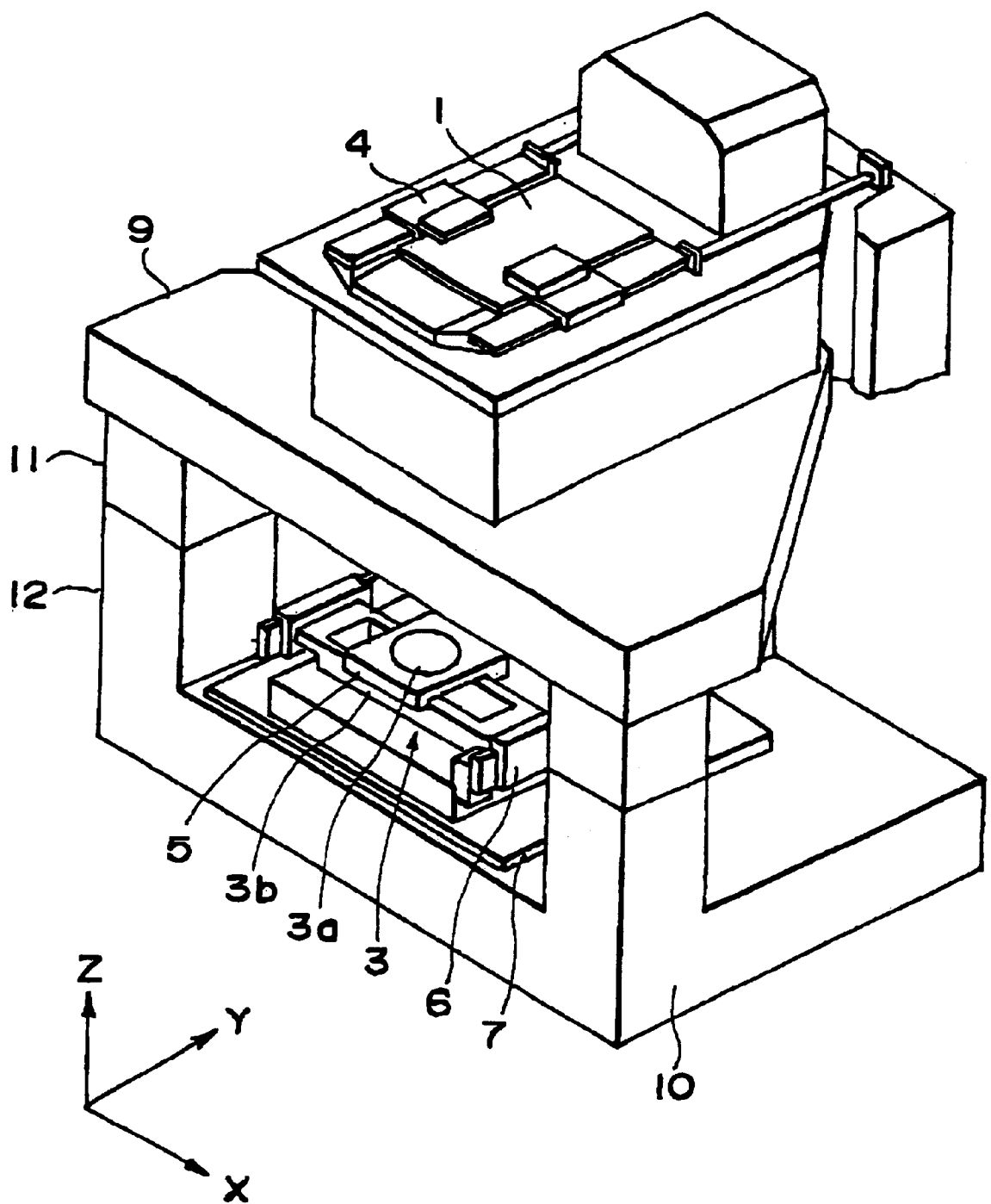
F I G. 2

MICRODEVICE MANUFACTURING APPARATUS

FIELD OF THE INVENTION AND RELATED ART

This invention relates to a device manufacturing apparatus such as an exposure apparatus or a semiconductor manufacturing apparatus, for example, for use in manufacture of microdevices such as a semiconductor device (e.g., IC or LSI), a liquid crystal device, an image pickup device (e.g., CCD) or magnetic head, for example. In another aspect, the invention is concerned with a wire assembling or pipe assembling method for such apparatus.

A semiconductor exposure apparatus for manufacture of semiconductor devices includes many component units such as, for example, a control rack having accommodated therein control systems for controlling operations of various components, laser interferometers for outputting detected signals to the control systems, an alingment detecting system, a sensor unit having a focus sensor, for example, a driving unit for driving actuators such as linear motors on the basis of signals from the control systems, a power unit for supplying electric powers necessary for the control and driving operations, and an air conditioning unit for controlling the temperature or the flow of air inside the exposure apparatus. These component units are connected through electric wires or cables (wiring arrangement) or through pipes (piping arrangement).

Some component units may vibrate due to a vibration source included therewithin or to external vibration transmitted thereto. Where these units are connected to other units through a wiring arrangement or a piping arrangement, vibration in a certain unit may be transmitted to another unit through a cable or a pipe. Particularly, in a case where the units are connected by shortest wiring or piping for minimization of the wiring or piping length, the vibration transmission will be large. Examples are an air conditioning system and a control rack, as described above. Generally, these component units include a fan motor for air conditioning. The fan motor may function as a vibration source by which the air conditioning system or the control rack itself may be vibrated. If the unit being vibrated is connected directly to a sensor unit or a driving unit through a cable, the vibration may be transmitted through this cable, such that the sensor unit or driving unit, or alternatively, a structure on which such component unit is mounted may vibrate.

SUMMARY OF THE INVENTION

It is an object of the present invention to provide an improved microdevice manufacturing apparatus and/or a wire assembling or pipe assembling method therefore.

It is another object of the present invention to provide a microdevice manufacturing apparatus of relatively large size and relatively complicated structure, such as a semiconductor exposure apparatus, for example, and/or a wire assembling or pipe assembling method therefore, by which transmission of vibration of any component unit to another component unit through an assembled electric wiring or piping arrangement can be prevented or reduced effectively.

In accordance with an aspect of the present invention, there is provided a device manufacturing apparatus, comprising: a plurality of units; and one of a cable element and a pipe element, for connecting one of said units with another, wherein the cable element or the pipe element connects the units through a member which is isolated from the units with respect to vibration.

In one preferred form of this aspect of the present invention, at least one of said units comprises a major assembly of an exposure apparatus for projecting a portion of a pattern of an original onto a substrate through a projection optical system while relatively and scanningly moving the original and the substrate relative to said projection optical system, to thereby transfer the pattern of the original onto the substrate.

The cable element or the pipe element may connect the major assembly of the exposure apparatus with one of an air conditioning system and a control system.

The pipe element may have a function as one of a vacuum pipe, a gas supplying/discharging pipe and a cleaning oil supplying/discharging pipe.

The isolated member may have a structure or a sufficient mass not excited by vibration of the units.

The cable or the pipe may extend between the units while being fixed to said isolated member.

The isolated member may comprise one of a frame on which the units are mounted, a floor on which the units are disposed, and a structure with an anti-vibration function.

The isolated member may be supported by a damper. The damper may comprise an active damper.

In accordance with another aspect of the present invention, there is provided a device manufacturing method for manufacturing a device by use of an exposure apparatus major assembly, another unit and one of a cable element and a pipe element for connecting the exposure apparatus major assembly with the unit through a member being isolated with respect to vibration, the method comprising the steps of: applying a photosensitive material to a wafer; exposing the wafer by use of the exposure apparatus major assembly; and developing the exposed wafer.

In accordance with a further aspect of the present invention, there is provided a method of connecting component units of a device manufacturing apparatus with each other by use of one of a cable element and a pipe element, characterized in that the cable element or the pipe element connects the units through a member which is isolated from the units with respect to vibration.

In one preferred form of this aspect of the present invention, the isolated member has a structure or a sufficient mass not excited by vibration of the units, and wherein the cable or the pipe connects the units while being fixed to the isolated member.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic and side view of an exposure apparatus according to an embodiment of the present invention.

FIG. 2 is a perspective view of the exposure apparatus of FIG. 1.

DESCRIPTION OF THE PREFERRED EMBODIMENTS

Figure 3:
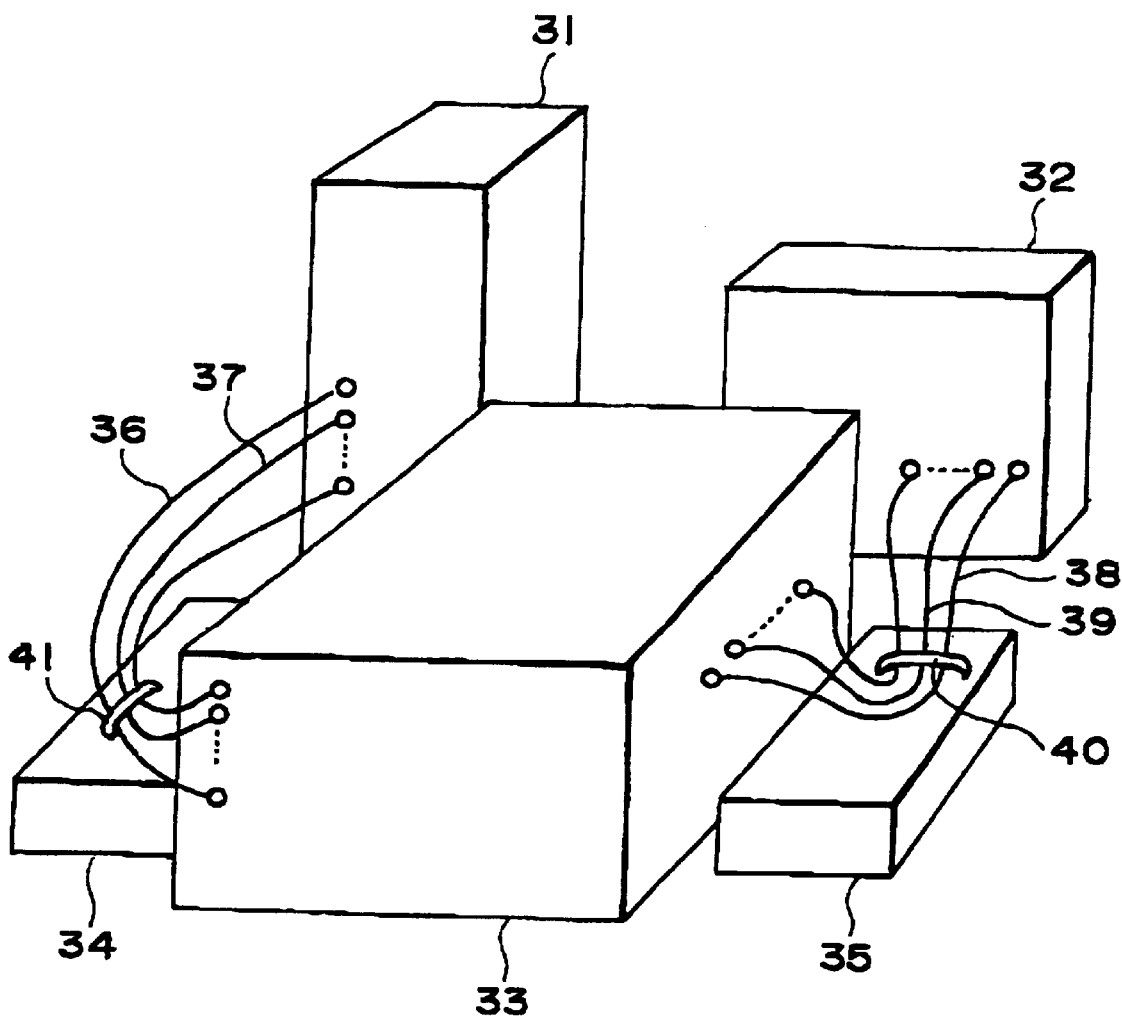
FIG. 3 is a perspective view for explaining an electric wire arrangement in the exposure apparatus of FIG. 1.

Preferred embodiments of the present invention will now be described with reference to the accompanying drawings.

FIG. 1 is a schematic and side view of an exposure apparatus according to the present invention, which is provided as one unit. FIG. 2 is a perspective view of the appearance of the exposure apparatus.

As shown in FIGS. 1 and 2, the exposure apparatus is a step-and-scan type exposure apparatus wherein a portion of a pattern of an original (reticle) placed on a reticle stage 1, is projected by a projection optical system 2 onto a water placed on a wafer stage 3, while the reticle and the wafer are relatively and scanningly moved in Y direction in synchronism with each other, relative to the projection optical system 2, by which the pattern of the reticle is transferred by exposure to the wafer. Also, the scan exposure operation described above is repeated to plural transfer regions (shots) on the wafer together with stepwise motion.

The reticle stage 1 can be moved in Y direction by a linear motor 4. The wafer stage 3 comprises an X stage 3a, which can be moved in X direction by a linear motor 5, and a Y stage 3b which can be moved in Y direction by a linear motor 6. The syrchronous scan of the reticle and the wafer is accomplished by moving the reticle stage 1 and the Y stage 3b in Y direction at a certain speed ratio, for example, 4:−1 (negative sign denotes that the direction is opposite). Also, the stepwise motion in X direction is accomplished by the X stage 3a. The X stage 3a has a Z-tilt stage (not shown) mounted thereon. There is a wafer chuck (not shown), mounted on the Z-tilt stage, for holding a wafer thereon.

The wafer stage is disposed on a stage base 7 which is supported at three points on a floor, for example, through three dampers 8. The reticle stage 1 and the projection optical system 2 are disposed on a barrel base 9 which is supported on a base frame 10, placed on the floor, through three dampers 11 and pillars 12. Each of the dampers 8 is an active damper which functions to actively damp or isolate vibration with respect to six axes. However, passive dampers may be used or, alternatively, the base may be supported without such dampers.

The exposure apparatus further comprises distance measuring means 13 such as a laser interferometer system or a micro-encoder system, for example, for measuring the distance between the barrel base 9 and the stage base 7 at three points.

Light projecting means 21 and light receiving means 22 cooperate to provide a focus sensor for detecting whether a wafer on the wafer stage 3 is placed at the focal plane of the projection optical system or not. More specifically, the light projecting means 21 which is fixedly mounted on the barrel base 9 projects light to the wafer along an oblique direction, and the position of reflected light therefrom is detected by the light receiving means 22, by which the position of the wafer surface with respect to the optical axis direction of the projection optical system 2 can be detected.

In the exposure apparatus of FIG. 1, light emitted from a laser interferometer light source (not shown) is introduced into a Y-direction laser interferometer 24 operable for the reticle stage. The light thus introduced into the Y-direction laser interferometer 24 is divided by a beam splitter (not shown) inside the laser interferometer 24, into light directed to a fixed mirror (not shown) inside the laser interferometer 24 and light directed to a Y-direction movable mirror 26. The light directed to the Y-direction movable mirror 26 goes along a Y-direction measurement light path 25 and it impinges on the Y-direction movable mirror 26, fixedly mounted on the reticle stage 4. The light reflected by the mirror goes back along the Y-direction measurement light path 25 and it impinges again on the beam splitter in the laser interferometer 24 where the light is superposed one upon another on the light reflected by the fixed mirror. By detecting a change in interference of light there, the moving distance in the Y direction can be measured. The moving distance information thus measured is fed back to a scan control system (not shown), by which the positioning control for the scan position of the reticle stage 4 is accomplished. As regards the Y stage 3b, similarly, the positioning control for the scan position it performed on the basis of a distance measurement result of a Y-direction laser interferometer 23, being operable for the wafer stage.

In operation with the structure described above, a wafer in conveyed by conveying means (not shown) along a conveyance path between two pillars 12, at the front of the exposure apparatus, and it is loaded on the wafer stage 3. After completion of a predetermined alignment operation, the exposure apparatus operates to transfer, by exposure, a pattern of a reticle onto plural exposure regions on the wafer while repeating scan exposure and stepwise motion. In the scan exposure, the reticle stage 1 and the Y stage 3b are moved in Y direction (scan direction) at a predetermined speed ratio, such that the pattern of the reticle is Scanned with slit-like exposure light. On the other hand, the wafer is scanned with a projected image of the reticle pattern being scanned. By this, the pattern of the reticle is transferred to a predetermined exposure region on the wafer. During the scan exposure, the height (level) of the wafer surface is measured by using the focus sensor, described hereinbefore. On the basis of the measured value, the height and tilt of the wafer stage 3 is controlled in real-time, by which focus correction is performed. Upon completion of the scan exposure to one exposure region, the X stage 3a is moved in X direction to move the wafer stepwise, to place the next exposure region at the scan start position. Then, the scan exposure is performed. Here, the layout of the exposure regions and the scan direction in either positive or neagtive Y direction as well as the order of exposures of the exposure regions, for example, are set so that sequential exposures of the exposure regions on the wafer can be performed efficiently.

FIG. 3 illustrates an example of an electric wire arrangement in the apparatus of FIG. 1. Denoted in FIG. 3 at 31 is a control rack, and denoted at 32 is an air conditioning unit for controlling the temperature and the flow of air in the exposure apparatus. Denoted 33 is a exposure apparatus major assembly (hereinafter, "major assembly") which is the one shown in FIG. 2. Denoted at 34 and 35 are vibration-suppressed or vibration-free structural members which are separate from the control rack 31 and the air conditioning unit 32. Cables 36, 37 and so on extending from the control rack 31 to the major assembly 33 are connected through the vibration-free structural member 34. To this end, the cables 36, 37 and so on are fixed to the structural member 34 by means of a wire fixing element 41 such as a cable cramp, for example. Similarly, cables 38, 39 and so on extending from the air conditioning unit 32 to the major assembly 33 are connected through the vibration-free structural member 35, and the cables 38, 39 and so on are fixed to the structural member 35 by means of a wire fixing element 40 such as a cable cramp, for example.

The air conditioning unit 32 is vibratory at a natural vibration frequency due to rotation of an air conditioning fan or a cooling compressor thereof. Without the vibration-free structural member 35, therefore, the vibration of the air conditioning unit may be transmitted through the cables 38, 39 and so on, to cause vibration of the major assembly. The vibration, if any, transmitted to the major assembly is adversely influential to the stage positioning precision or the alignment precision. In accordance with this embodiment, as compared therewith, the cables 38, 39 and so on are cramped to the anti-vibration structural member 35 by use of the wire fixing element 40. This accomplished a wiring arrangement with which any vibration of the air conditioning unit 32 is not transmitted to the major assembly. The structural member 35 has a structure or a sufficient mass not excited by vibration from the air conditioning unit 32. While in FIG. 3 the structural member 35 is made separate from the major assembly, the base frame 10 shown in FIG. 2 may be provided by a vibration-free structural member, if it satisfies the above-described condition. Alternatively, the floor may be used as a vibration-free structure.

Similarly, the control rack 31 is vibratory at a natural vibration frequency due to rotation of an air conditioning fan. Since the cables 36, 37 and so on extending from the control rack 31 are fixed to the anti-vibration structural member 34 and then they are connected to the major assembly 33, any vibration of the control rack 31 is not transmitted to the major assembly 33.

Figure 6:
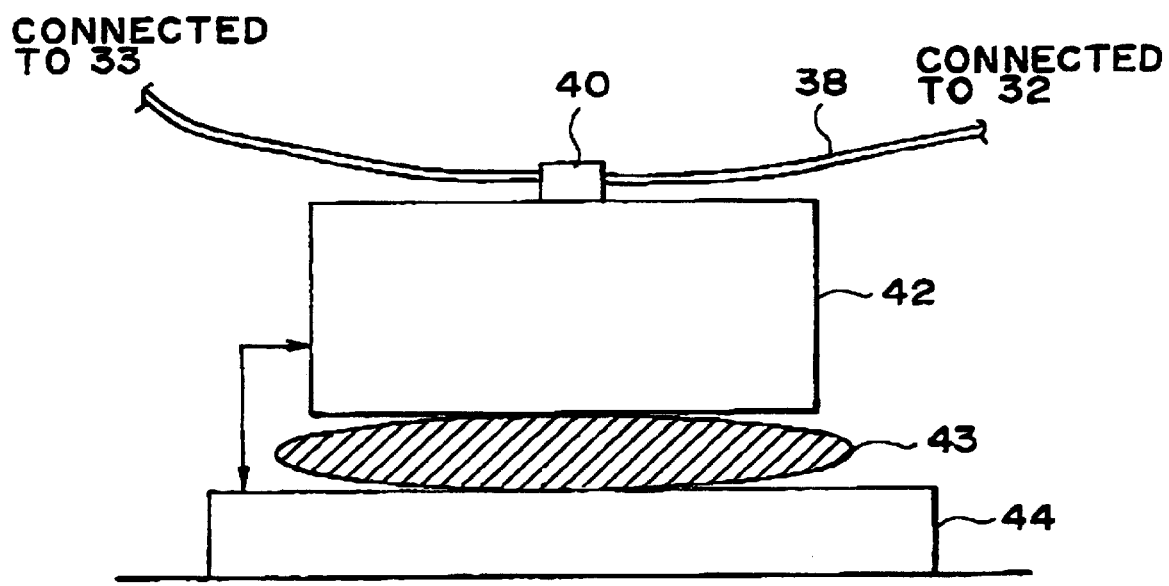
FIG. 6 is a schematic view for explaining an example of an anti-vibration structure.
Figure 7:
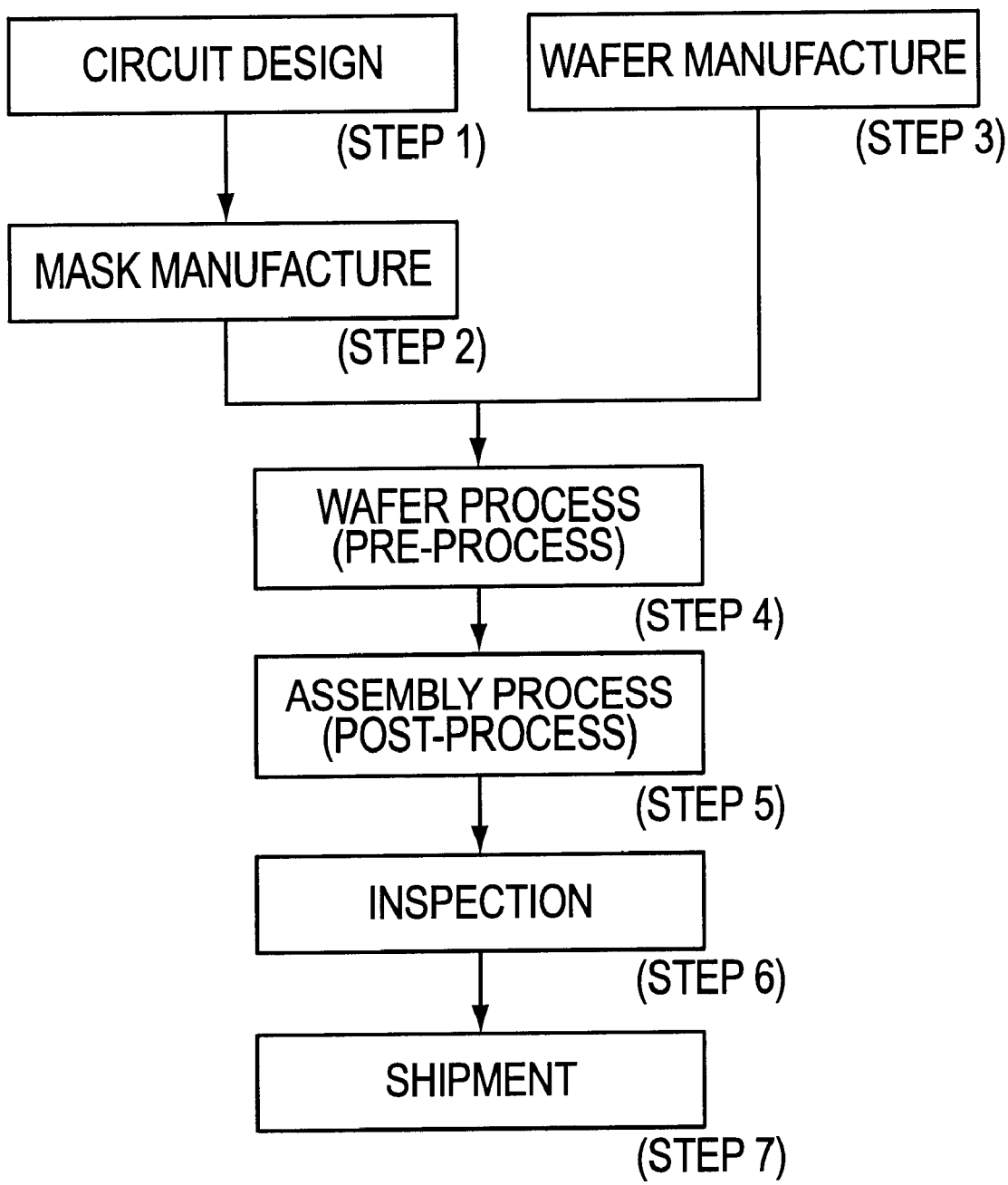
FIG. 7 is a flow chart of microdevice manufacturing processes.
Figure 8:
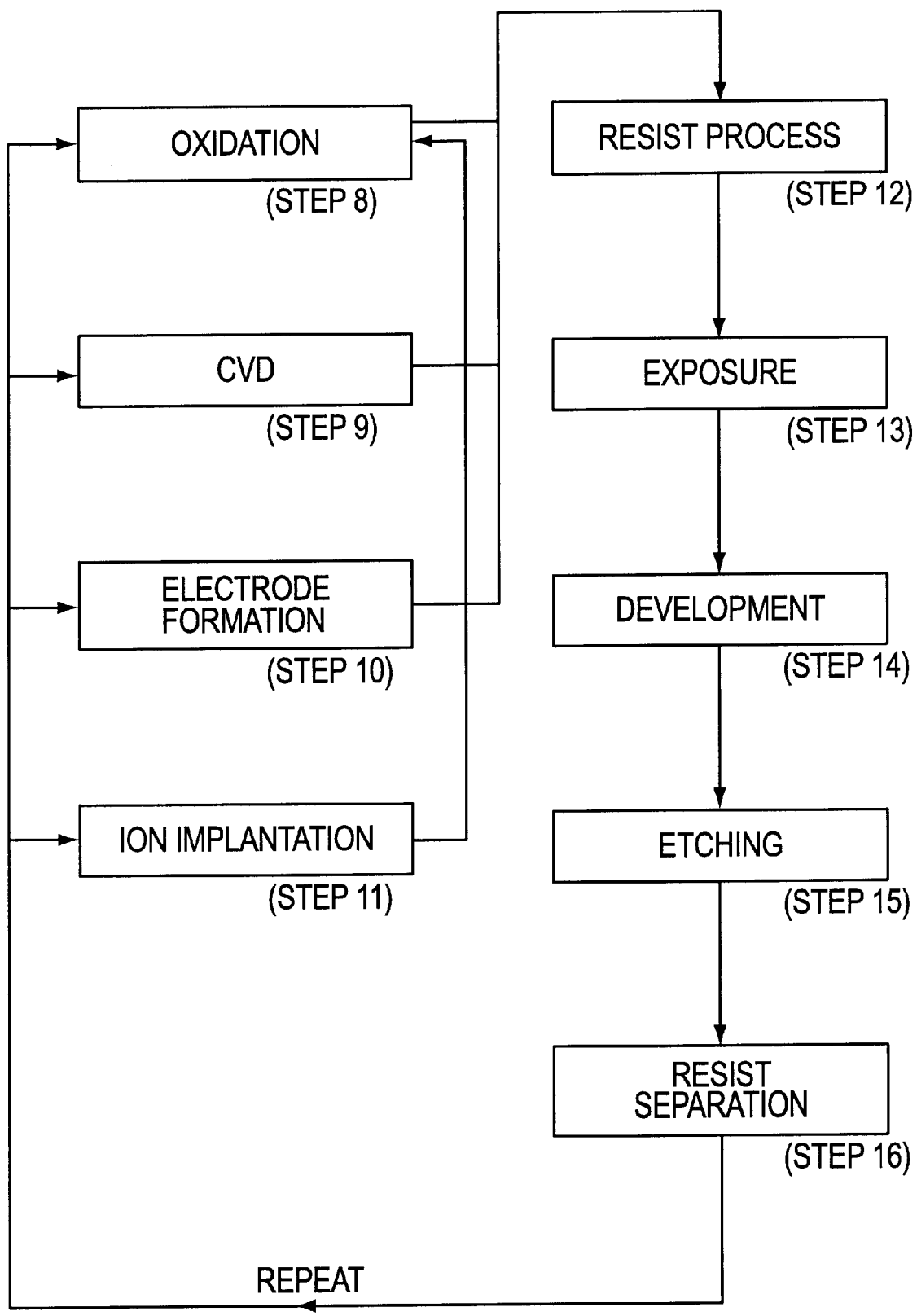
FIG. 8 is a flow chart for explaining details of a wafer process, included in the procedure of FIG. 7.

FIG. 6 is a schematic view for explaining an example where a damper is used for vibration insulation, in place of the vibration-free structural member 34 or 35. Denoted at 42 is a damper movable portion on which a cable 38, connected to the air conditioning unit 32 and the major assembly 33, is fixed by means of a wire fixing element 40. The damper 43 may be a passive or active damper having multi-axis freedoms. Denoted at 44 is a stationary portion for supporting the damper. In the case of an active damper, position servo may be applied so that the portions 42 and 44 are held in a certain positional relation with each other. With the structure described above, even if the cable 38 swings due to vibration of the air conditioning unit 32, it is absorbed by the damper (42, 43), and the vibration is sufficiently attenuated. Therefore, only a small magnitude of vibration, not influential to the apparatus performance, is transmitted to the major assembly 33.

Figure 4:
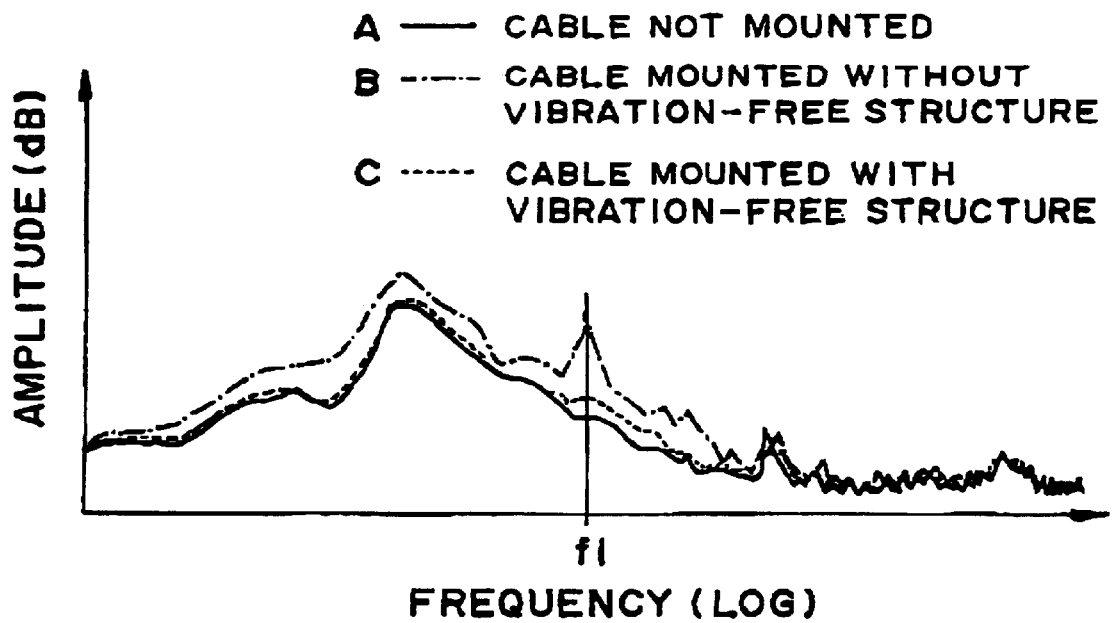
FIG. 4 is a graph for explaining a dark vibration level in the apparatus of FIG. 1 with the electric wire arrangement mounted, in comparison with a case where a cable not mounted and a case of conventional arrangement.

FIG. 4 illustrates differences in Z-direction dark vibration level, upon the major assembly 33 due to the cable arrangement. A solid line A in the graph depicts the dark vibration level upon the barrel base 9, in a state wherein no cable is mounted. A dash-and-dot line B is a curve which depicts the dark vibration upon the barrel base 9 in a case where cables are directly connected from the control rack 31 and the air conditioning unit 32 to the major assembly 33, without intervention of the vibration-free structural member 34 or 35. In the case of direct connection (dash-and-dot line B), there is a high peak at a frequency $f_1$, as compared with the case (solid line A) where no cable is mounted. This frequency $f_1$ corresponds to the frequency attributable to the rotation of the fan in the air conditioning unit 32. Also, at frequencies lower than $f_1$, the dark vibration level is generally higher in the case of direct connection (dash-and-dot line B), as compared with the case (solid line A) where no cable is mounted.

Figure 5A:
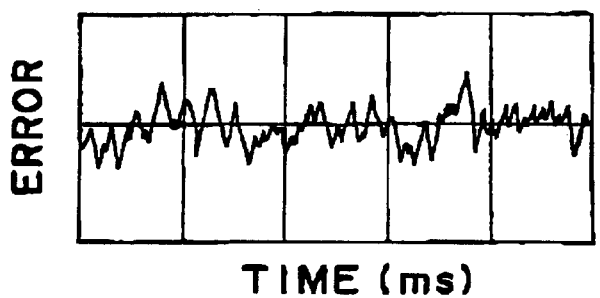
FIGS. 5A and 5B are graphs, respectively, for explaining a stage positioning precision in the apparatus of FIG. 1, as compared with that in a conventional arrangement.

As described hereinbefore, if in an exposure apparatus there is vibration having such a strong peak, it causes external disturbance to a control system and adversely affects the exposure precision or alignment precision. FIG. 5A illustrates the positioning precision for a stage in the case of direction connection (dash-and-dot line B) shown in FIG. 4. The axis of abscissa denotes the time, and the axis of ordinate denotes the error. It is seen from the graph that, due to external disturbance applied from the control rack 31 or the air conditioning unit 32, the positioning is not stabilized but dispersive.

Figure 5B:
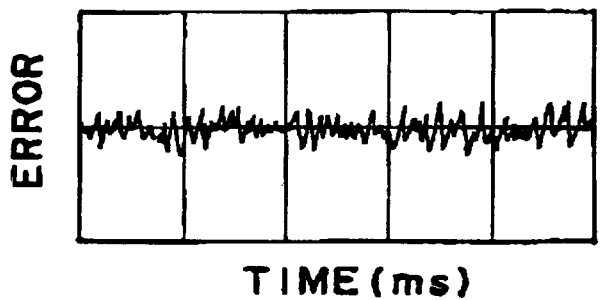

A broken line C in FIG. 4 is a curve that depicts the dark vibration upon the barrel base, in a case where cables from the control rack 31 and the air conditioning unit 32 are cramped to the vibration-free structural members 34 and 35, respectively, and then the cables are connected to the major assembly 33. In this case, the dark vibration is lowered to substantially the same level as that of the case where no cable is mounted (solid line A). Thus, it is seen that any vibration from the air conditioning unit 32 or the control rack 31 is isolated by the structural member 34 or 35, and it is not transmitted to the major assembly 33. FIG. 5B illustrates the positioning precision for the stage with respect to wx rotational direction, in the state corresponding to the broken line C of FIG. 4. The axis of abscissa denotes the time, and the axis of ordinate denotes the error. It is seen that, as compared with FIG. 5A, the error in FIG. 5B is smaller, and that, with the present invention, the positioning precision in the exposure apparatus is improved.

While the foregoing description has been made with reference to examples using an electric cable, the present invention is not only applicable to the mount of an electric cable but also to the mount of any connection, such as a pipe, for connecting plural units with each other. For example, the exposure apparatus of FIG. 1 uses vacuum for attracting and holding a wafer onto the wafer stage, or a gas (high-pressure clean air, for example) to be supplied to a static gas bearing, for example. For supply of such vacuum or air, a pipe for air supply from the air conditioning unit 32 may be connected to the wafer stage 3. Alternatively, while the apparatus uses a cooling oil for cooling the linear motor 5, for example, a pipe for flowing such cooling oil may be connected from the air conditioning unit 32 to the linear motor 5. Since the piping arrangement for supplying an air, a vacuum or a cooling oil may function to transmit vibration of the air conditioning unit to the major assembly 33, like the case of the electric wire, the pipe may be cramped to the vibration-free structural member 35 and then it may be connected to the major assembly. With this structure, transmission of vibration from the air conditioning unit 32 to the major assembly 33 can be prevented.

While the invention has been described with reference to the structures disclosed herein, it is not confined to the details set forth and this application is intended to cover such modifications or changes as may come within the purposes of the improvements or the scope of the following claims.

What is claimed is:

1. An exposure apparatus comprising:

a barrel base for supporting a projection optical system;

a unit having at least one of an air conditioning system for performing air conditioning to a main assembly of the exposure apparatus and a control system for performing control of the main assembly;

a member being isolated from said barrel base with respect to vibration; and one of a cable element and a pipe element, for connecting said barrel base to said unit through said member.

2. An apparatus according to claim 1, wherein said exposure apparatus is operable to project a portion of a pattern of an original onto a substrate through said projection optical system, while relatively and scanningly moving the original and the substrate relative to said projection optical system, to thereby transfer the pattern of the original onto the substrate.

3. An apparatus according to claim 1, wherein the pipe element has a function as one of a vacuum pipe, a gas supplying/discharging pipe and a cleaning oil supplying/discharging pipe.

4. An apparatus according to claim 1, wherein said isolated member has a structure or a sufficient mass not excited by vibration of the units.

5. An apparatus according to claim 1, wherein the cable or the pipe extends between the units while being fixed to said isolated member.

6. An apparatus according to claim 1, wherein said isolated member comprises one of a frame on which the units are mounted, a floor on which the units are disposed, and a structure with an anti-vibration function.

7. An apparatus according to claim 1, wherein the isolated member is supported by a damper.

8. An apparatus according to claim 7, wherein said damper comprises an active damper.

9. A device manufacturing method for manufacturing a device by use of an exposure apparatus major assembly, the method comprising the steps of:

providing a barrel base to support a projection optical system;

providing a unit having at least one of an air conditioning system for performing air conditioning to the major assembly of the exposure apparatus and a control system for performing control of the major assembly;

providing a member isolated from said barrel base with respect to vibration;

providing one of a cable element and a pipe element to connect said barrel base to said unit through said member;

applying a photosensitive material to a wafer;

exposing the wafer by use of the exposure apparatus major assembly; and developing the exposed wafer.

10. A method of connecting component units of a device manufacturing apparatus with each other comprising the steps of:

forming an exposure apparatus by:

providing a barrel base to support a projection optical system;

providing a unit having at least one of an air conditioning system for performing air conditioning to a major assembly of the exposure apparatus and a control system for performing control of the major assembly;

providing a member isolated from said barrel base with respect to vibration;

using one of a cable element and a pipe element to connect said barrel base to said unit;

characterized in that the cable element or the pipe element connects the barrel base to the unit through the member which is isolated from the unit with respect to vibration.

11. A method according to claim 10, wherein said isolated member has a structure or a sufficient mass not excited by vibration of the unit, and wherein the cable element or the pipe element connects the unit while being fixed to the isolated member.

* * * * *

UNITED STATES PATENT AND TRADEMARK OFFICE
CERTIFICATE OF CORRECTION

PATENT NO. : 6,396,562 B1
DATED : May 28, 2002
INVENTOR(S) : Takehiko Iwanaga

It is certified that error appears in the above-identified patent and that said Letters Patent is hereby corrected as shown below:

Column 3,
Line 32, "syrchronous" should read -- synchronous --.

Column 4,
Line 20, "it" should read -- is --.
Line 24, "in" should read -- is --.
Line 34, "Scanned" should read -- scanned --.
Line 48, "neagtive" should read -- negative --.
Line 57, "Denoted 33 is a" should read -- Denoted at 33 is an --.

Column 5,
Line 16, "accomplished" should read -- accomplishes --.

Column 8,
Line 21, "vibration;" should read -- vibration; and --
Line 23, "unit;" should read -- unit, --.

Signed and Sealed this

Twenty-seventh Day of August, 2002

Attest:

*Attesting Officer*

JAMES E. ROGAN
*Director of the United States Patent and Trademark Office*